US009619392B2

(12) United States Patent
Do et al.

(10) Patent No.: US 9,619,392 B2
(45) Date of Patent: Apr. 11, 2017

(54) ELECTRONIC DEVICE AND METHOD FOR FABRICATING THE SAME

(71) Applicant: SK hynix Inc., Icheon-si (KR)

(72) Inventors: Kwan-Woo Do, Icheon-si (KR); Ki-Seon Park, Icheon-si (KR); Ga-Young Ha, Icheon-si (KR); Gil-Jae Park, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 50 days.

(21) Appl. No.: 14/686,453

(22) Filed: Apr. 14, 2015

(65) Prior Publication Data

US 2016/0079524 A1 Mar. 17, 2016

(30) Foreign Application Priority Data

Sep. 15, 2014 (KR) .................. 10-2014-0122258

(51) Int. Cl.
*H01L 45/02* (2006.01)
*G06F 12/0868* (2016.01)
*H01L 43/02* (2006.01)
*H01L 43/08* (2006.01)
*H01L 27/22* (2006.01)
*H01L 27/24* (2006.01)

(52) U.S. Cl.
CPC ........ *G06F 12/0868* (2013.01); *H01L 27/222* (2013.01); *H01L 43/02* (2013.01); *H01L 43/08* (2013.01); *G06F 2212/1024* (2013.01); *G06F 2212/202* (2013.01); *G06F 2212/313* (2013.01); *H01L 27/24* (2013.01)

(58) Field of Classification Search
None
See application file for complete search history.

(56) References Cited

U.S. PATENT DOCUMENTS

| 5,641,580 A | * | 6/1997 | Sampath | C22C 32/0052 148/407 |
| 6,121,648 A | * | 9/2000 | Evans, Jr. | H01L 27/11502 257/295 |
| 7,723,767 B2 | * | 5/2010 | Li | H01L 21/31155 257/300 |
| 9,224,951 B1 | * | 12/2015 | Wang | H01L 45/145 |
| 9,255,029 B2 | * | 2/2016 | Veerasamy | C03C 17/2453 |
| 9,330,928 B2 | * | 5/2016 | Tong | H01L 21/3065 |
| 9,331,276 B2 | * | 5/2016 | Chiang | H01L 45/1253 |
| 2009/0039332 A1 | * | 2/2009 | Lee | H01L 45/04 257/4 |
| 2013/0001501 A1 | * | 1/2013 | Sills | H01L 45/04 257/4 |
| 2013/0001652 A1 | | 1/2013 | Yoshikawa et al. | |
| 2014/0268993 A1 | * | 9/2014 | Chiang | G11C 13/0002 365/148 |
| 2015/0028281 A1 | * | 1/2015 | Chen | H01L 45/1253 257/4 |

(Continued)

FOREIGN PATENT DOCUMENTS

KR 1020080049628 A 6/2008

*Primary Examiner* — Michael Lebentritt
(74) *Attorney, Agent, or Firm* — Perkins Coie LLP

(57) ABSTRACT

An electronic device includes a semiconductor memory that includes: a variable resistance element formed over a substrate; and a carbon-containing aluminum nitride layer formed on sidewalls and in an upper portion of the variable resistance element.

9 Claims, 12 Drawing Sheets

(56) References Cited

U.S. PATENT DOCUMENTS

| | | | |
|---|---|---|---|
| 2015/0129827 A1* | 5/2015 | Chen | H01L 45/06 257/4 |
| 2015/0188039 A1* | 7/2015 | Wang | H01L 45/12 257/4 |
| 2016/0020388 A1* | 1/2016 | Wang | H01L 45/08 257/3 |

* cited by examiner

ELECTRONIC DEVICE AND METHOD FOR FABRICATING THE SAME

CROSS-REFERENCE TO RELATED APPLICATIONS

This patent document claims priority of Korean Patent Application No. 10-2014-0122258, entitled "ELECTRONIC DEVICE AND METHOD FOR FABRICATING THE SAME" and filed on Sep. 15, 2014, which is incorporated herein by reference in its entirety.

BACKGROUND

This patent document relates to memory circuits or devices and their applications in electronic devices or system.

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on and research and development for such electronic devices have been conducted. Examples of such semiconductor devices include electronic devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device including a semiconductor memory that may prevent sidewalls of a variable resistance element from being oxidized and improve characteristics of the variable resistance element, and a method for fabricating the electronic device.

In one aspect, an electronic device is provided to include a semiconductor memory that includes: a substrate; a variable resistance element formed over the substrate; and a carbon-containing layer formed over the variable resistance element and including carbon that gathers oxygen.

In some implementations, the carbon-containing layer includes a single or a double layer. In some implementations, the carbon-containing layer includes an aluminum nitride layer containing carbon and oxygen and another aluminum nitride layer containing carbon. In some implementations, the carbon-containing layer includes 10% or more of carbon. In some implementations, the carbon-containing layer is formed on sidewalls and in an upper portion of the variable resistance element.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable pattern is part of the cache memory unit in the processor.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable pattern is part of the storage device or the temporary storage device in the data storage system.

In some implementations, the electronic device may further include a carbon-free layer formed over the carbon-containing layer. In some implementations, the carbon-containing layer includes a staked structure of an aluminum nitride layer containing carbon and oxygen and an aluminum nitride layer containing carbon.

In another aspect, a method for fabricating an electronic device including a semiconductor memory is provided. The method may include: forming a variable resistance element over a substrate to have different resistance states for storing data; and forming a carbon-containing layer over the variable resistance element to have an sufficient amount of carbon to gather oxygen against oxidation of the variable resistance element.

In some implementations, the method may further include: performing a thermal process after the forming of the carbon-containing layer. In some implementations, the performing of the thermal process includes converting a surface of the carbon-containing layer coupled with the variable resistance element to contain carbon and oxygen. In some implementations, the method may further include: forming a carbon-free layer over the carbon-containing layer. In some implementations, the forming of the carbon-containing layer and the forming of the carbon-free layer include performing an Atomic Layer Deposition (ALD) process. In some implementations, the performing of the ALD process includes proceeding any combination of a source injection process, a first purge process, a plasma process, or a second purge process. In some implementations, the performing of the ALD process includes, during the source injection process, using a carbon-containing source including Trimethyl Aluminum (TMA: $(CH_3)_3Al$), Tris(tertiary-buty)Aluminum (TTBA: $Al[C(CH_3)_3]_3$), or aluminum chloride ($AlCl_3$). In some implementations, the performing of the ALD process includes, during the plasma process, using a reaction gas including $N_2$ or $H_2$, or a mixed gas including $N_2/H_2$ or $NH_3$. In some implementations, the performing of the ALD process includes, during the plasma process, controlling a plasma process power such that the plasma process power of the forming of the carbon-containing layer is smaller than that of the forming the carbon-free layer.

In some implementations, the performing of the ALD process includes, during the plasma process, controlling an amount of a reaction gas such that the reaction gas injection amount for forming the carbon-containing layer is smaller than that for forming the carbon-free layer. In some implementations, the forming of the carbon-containing layer and the forming of the carbon-free layer are carried out in-situ in the same chamber.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable pattern is part of the auxiliary memory device or the main memory device in the processing system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable pattern is part of the memory or the buffer memory in the memory system.

DETAILED DESCRIPTION

Figure 1A:
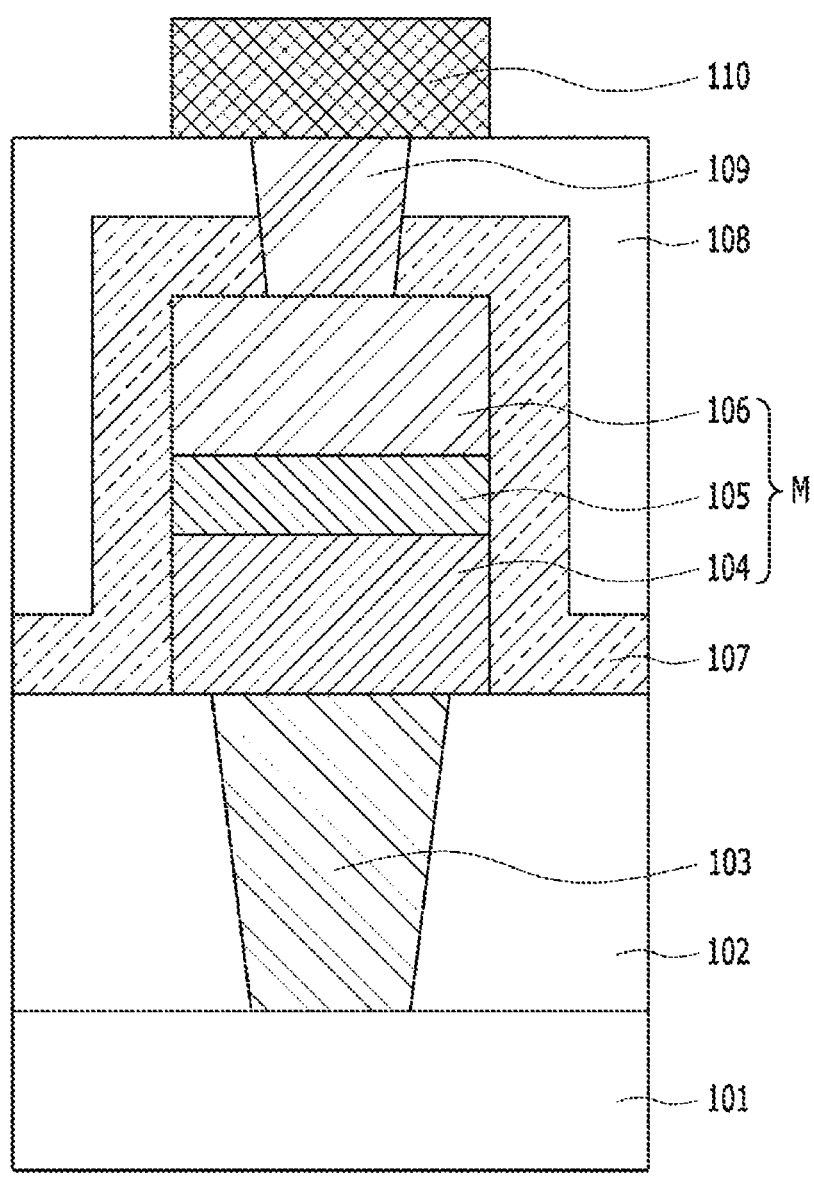
FIGS. 1A and 1B are cross-sectional views illustrating a semiconductor device in accordance with an implementation of the technology disclosed in this patent document.

Various examples and implementations of the disclosed technology are described below in detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
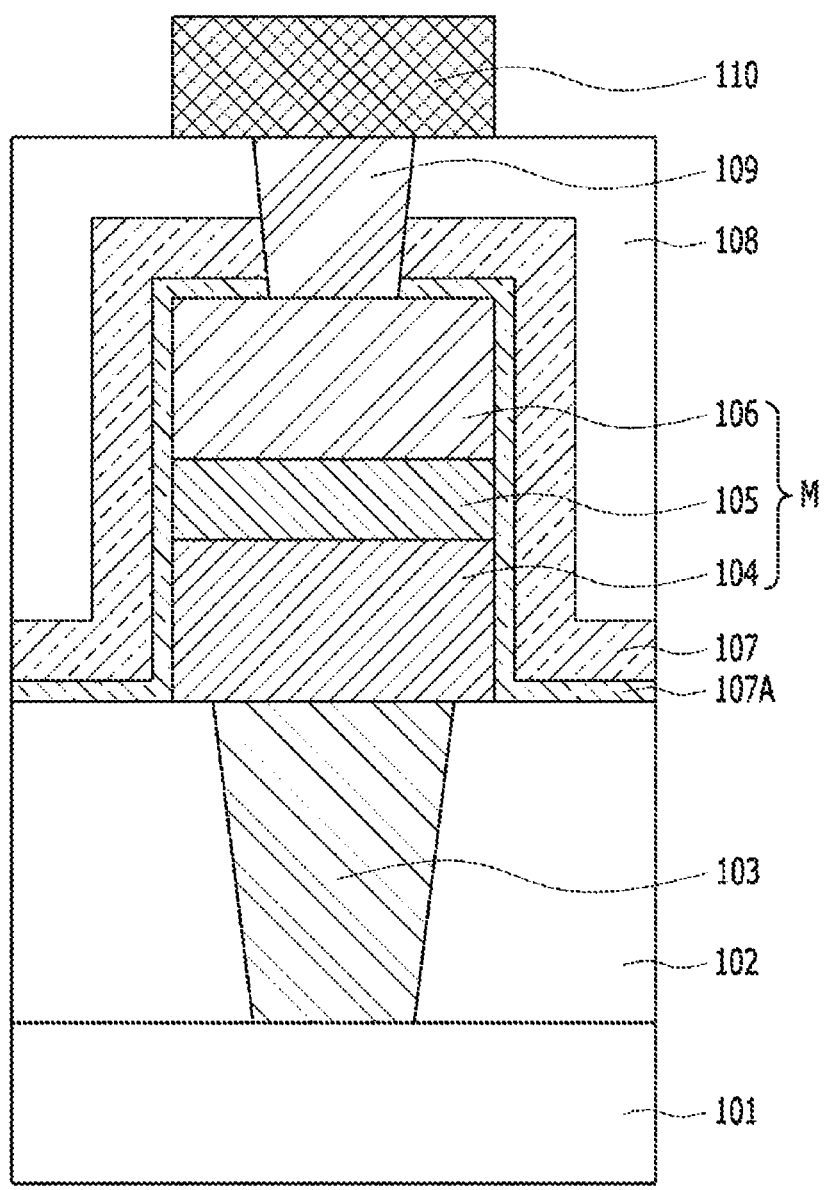

FIGS. 1A and 1B are cross-sectional views illustrating a semiconductor device in accordance with an implementation of the technology disclosed in this patent document.

Referring to FIG. 1A, the semiconductor device may include a predefined structure, e.g., a substrate 101 where a switching element (not shown) is formed. A first inter-layer dielectric layer 102 is formed over the substrate 101. A first contact plug 103 is formed to pass through the first inter-layer dielectric layer 102 and be coupled with the substrate 101. Variable resistance elements M are coupled with the first contact plug 103. A carbon-containing aluminum nitride layer 107 is formed over the structure including the variable resistance elements M. A second inter-layer dielectric layer 108 is formed to fill the space between the variable resistance elements M. A conductive line 110 is formed over the second inter-layer dielectric layer 108. A second contact plug 109 is formed to couple the conductive line 110 with the variable resistance elements M.

The variable resistance elements M may include a stacked structure including a first magnetic layer 104, a tunnel barrier layer 105, and a second magnetic layer 106.

The variable resistance elements M may have the property of switching different resistance states based on magnetization directions of the first and second magnetic layers 104 and 106. For example, when the magnetization directions of the first and second magnetic layers 104 and 106 are the same or parallel to each other, the variable resistance elements M may have a low-resistance state, and when the magnetization directions of the first and second magnetic layers 104 and 106 are different from each other or anti-parallel to each other, the variable resistance elements M may have a high-resistance state.

One of the first magnetic layer 104 and the second magnetic layer 106 may be a pinned ferromagnetic layer whose magnetization direction is fixed, and the other may be a free ferromagnetic layer whose magnetization direction is varied based on a direction of current applied to the variable resistance elements M. Each of the first and second magnetic layers 104 and 106 may be a single layer or a multi-layer including a ferromagnetic material such as a Fe—Pt alloy, a Fe—Pd alloy, a Co—Pd alloy, a Co—Pt alloy, a Co—Fe alloy, a Fe—Ni—Pt alloy, a Co—Fe—Pt alloy and/or a Co—Ni—Pt alloy, and the single layer or the multi-layer may further include an impurity such as boron (B) but the disclosed technology in this patent document is not limited to this implementation.

The tunnel barrier layer 105 may allow electron tunneling and change the magnetization direction of the free ferromagnetic layer. The tunnel barrier layer 105 may be a single layer or a multi-layer including a dielectric material, e.g., an oxide such as $Al_2O_3$, MgO, CaO, SrO, TiO, VO and/or NbO, but the disclosed technology in this patent document is not limited to this implementation.

Although not illustrated, the variable resistance elements M may further include a first electrode (not shown) and a second electrode (not shown) in the lower portion of the first magnetic layer 104 and the upper portion of the second magnetic layer 106, respectively. Also, the variable resistance elements M may further include a template layer, a combination layer and an interface layer for improving characteristics of the respective magnetic layers.

In one implementation, the carbon-containing aluminum nitride layer 107 may be formed over the structure including the variable resistance elements M as a capping layer. The carbon-containing aluminum nitride layer 107 may be represented by AlCN.

The carbon-containing aluminum nitride layer (AlCN) 107 may have an effect which allows unstable carbon (C) contained in the layer to gather oxygen in the variable resistance elements M. As the oxygen is gathered on sidewalls of the variable resistance elements M, this gathering effect is against oxidation of the variable resistance element and thus the sidewalls of the variable resistance elements M may be prevented from being oxidized. In order to have the oxygen gathering effect, the carbon content in the layer may be at least more than 10%. The carbon-containing aluminum nitride layer 107 may improve the resistance characteristics of the variable resistance elements M by deoxidizing a pre-oxidized part of the variable resistance elements M. For example, since the sidewalls of the variable resistance element M can be prevented from being oxidized, the decrease in the resistance of the variable resistance element M that is caused by the oxidization of the variable resistance element M does not occur, thereby improving the resistance characteristics of the variable resistance element M.

The first contact plug 103 and the second contact plug 109 may include a semiconductor layer or a metallic layer, and the line widths or occupying areas of the first and second contact plugs 103 and 109 may be smaller than the line width of the variable resistance elements M. The first contact plug 103 may be or include a Bottom Electrode Contact (BEC) coupling the variable resistance elements M with a switching element, and the second contact plug 109 may be or include a Top Electrode Contact (TEC) coupling the variable resistance elements M with the conductive line 110.

The conductive line 110 may include a metallic layer. The metallic layer includes a conductive layer including a metallic element and may include a metal layer, a metal oxide layer, a metal nitride layer, a metal oxide-nitride layer, or a metal silicide layer, etc.

The switching element (not shown) is for selecting a predetermined unit cell in the semiconductor device including a plurality of unit cells. The switching element may be disposed in every unit cells and include a transistor or a diode, etc. One side of the switching element may be electrically connected to the first contact plug 103, and the other side of the switching element may be electrically connected to a non-illustrated line, e.g., a source line.

Referring to FIG. 1B, the carbon-containing aluminum nitride layer 107 formed over the structure including the variable resistance elements M may be formed of a double layer. The aluminum nitride layer 107 may include a stacked structure of an aluminum nitride layer 107A containing carbon and oxygen and an aluminum nitride layer 107 containing carbon. For example, the aluminum nitride layer 107A containing carbon and oxygen may be represented by $AlCO_xN$, where x is a natural number. The aluminum nitride layer 107A containing carbon and oxygen may be formed by an oxygen gathering effect of the aluminum nitride layer 107 containing carbon. The aluminum nitride layer 107A containing carbon and oxygen may be formed on a surface of the aluminum nitride layer 107 coupled with the variable resistance elements M.

The aluminum nitride layer 107A containing carbon and oxygen may be formed through a thermal process. As unstable carbon in the aluminum nitride layer 107 containing carbon gathers oxygen of the variable resistance elements M through the thermal process after the elements shown in FIG. 1A are formed, the aluminum nitride layer 107A containing carbon and oxygen may be formed on the surface of the aluminum nitride layer 107 coupled with the variable resistance elements M. The final structure formed by the gathering effect may be or include a stacked structure of $AlCO_xN$ 107A (where x is a natural number) and the carbon-containing aluminum nitride layer (AlCN) 107.

Although it is described that a process for gathering oxygen in the variable resistance elements M is carried out through a thermal process, other implementations are also possible. For example, the carbon-containing aluminum nitride layer 107 may be formed as shown in FIG. 1A, and then, a gathering effect may be obtained through the thermal process that is necessarily carried out during a subsequent process.

Figure 2A:
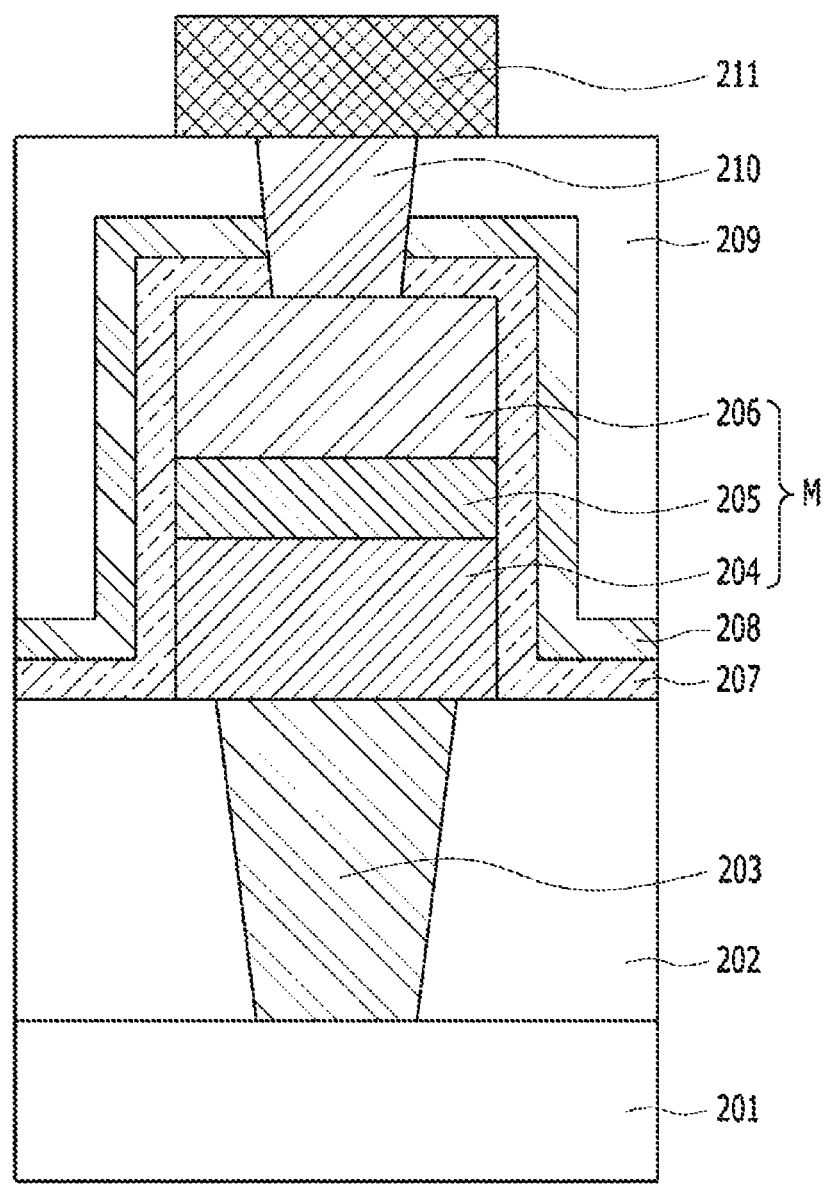
FIGS. 2A and 2B are cross-sectional views illustrating a semiconductor device in accordance with another implementation of the technology disclosed in this patent document.
Figure 2B:
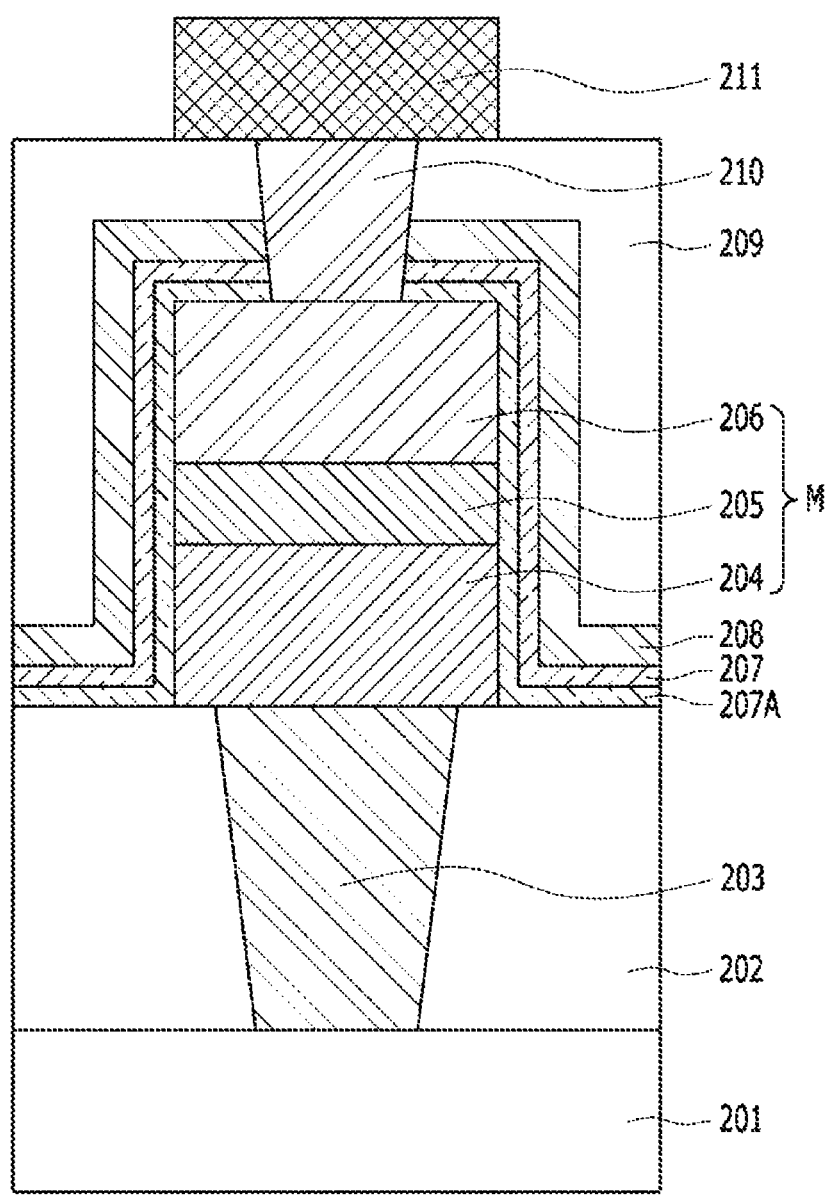

FIGS. 2A and 2B are cross-sectional views illustrating a semiconductor device in accordance with another implementation of the technology disclosed in this patent document.

Referring to FIG. 2A, the semiconductor device may include a predefined structure, e.g., a substrate 201 where a switching element (not shown) is formed. A first inter-layer dielectric layer 202 may be formed over the substrate 201. A first contact plug 203 may be formed to pass through the first inter-layer dielectric layer 202 and be coupled with the substrate 201. Variable resistance elements M may be formed to be coupled with the first contact plug 203. A first aluminum nitride layer 207 containing carbon may be formed over the structure including the variable resistance elements M. A second aluminum nitride layer 208 not containing carbon, a second inter-layer dielectric layer 209 filling the space between the variable resistance elements M may be formed. A conductive line 211 may be formed over the second inter-layer dielectric layer 209. A second contact plug 210 may be formed to couple the conductive line 211 with the variable resistance elements M.

The switching element (not shown), the substrate 201, the first inter-layer dielectric layer 202, the first contact plug 203, the variable resistance elements M, the second inter-layer dielectric layer 209, the second contact plug 210, and the conductive line 211 may be the same as those shown in FIG. 1A.

In this implementation, a stacked structure of the first aluminum nitride layer 207 containing carbon and the second aluminum nitride layer 208 not containing carbon may be formed over the structure including the variable resistance elements M as a capping layer. For example, the first aluminum nitride layer 207 containing carbon may be represented by AlCN, and the second aluminum nitride layer 208 not containing carbon may be represented by AlN.

The first aluminum nitride layer 207 containing carbon may have an effect which allows unstable carbon (C) contained in the layer to gather oxygen in the variable resistance elements M. As the oxygen is gathered on sidewalls of the variable resistance elements M, the sidewalls of the variable resistance elements M may be prevented from being oxidized. In order to have the oxygen gathering effect, the carbon content in the layer may be at least more than 10%. The first aluminum nitride layer 207 containing carbon may improve characteristics of the variable resistance elements M by deoxidizing a pre-oxidized part of the variable resistance elements M.

The second aluminum nitride layer 208 not containing carbon may serve as a blocking layer that blocks oxygen supplied from an external device.

Referring to FIG. 2B, the first aluminum nitride layer 207 containing carbon and formed over the structure including the variable resistance elements M may be formed of a double layer. The first aluminum nitride layer 207 may include a stacked structure of an aluminum nitride layer 207A containing carbon and oxygen and the aluminum nitride layer 207 containing carbon. For example, the aluminum nitride layer 207A containing carbon and oxygen may be represented by $AlCO_xN$, where x is a natural number. The aluminum nitride layer 207A containing carbon and oxygen may be formed by an oxygen gathering effect of the first aluminum nitride layer 207 containing carbon. The aluminum nitride layer 207A containing carbon and oxygen may be formed on a surface of the first aluminum nitride layer 207 coupled with the variable resistance elements M.

The aluminum nitride layer 207A containing carbon and oxygen may be formed through a thermal process. As unstable carbon in the first aluminum nitride layer 207 containing carbon gathers oxygen of the variable resistance elements M through the thermal process after the elements shown in FIG. 2A are formed, the aluminum nitride layer 207A containing carbon and oxygen may be formed on the surface of the first aluminum nitride layer 207 coupled with the variable resistance elements M. The final structure formed by the gathering effect may be a stacked structure of $AlCO_xN$ 207A (where x is a natural number), the first aluminum nitride layer (AlCN) 207 and the second aluminum nitride layer (AlN) 208.

Although a process for gathering oxygen in the variable resistance elements M is carried out through a thermal process in this implementation, other implementations are also possible. For example, the stacked structure of the first aluminum nitride layer 207 containing carbon and the second aluminum nitride layer 208 not containing carbon may be formed as shown in FIG. 2A, and then, a gathering effect may be obtained through the thermal process that is necessarily carried out during a subsequent process.

FIGS. 3A to 3D are cross-sectional views illustrating a method for fabricating a semiconductor device in accordance with an implementation of the technology disclosed in this patent document.

Figure 3A:
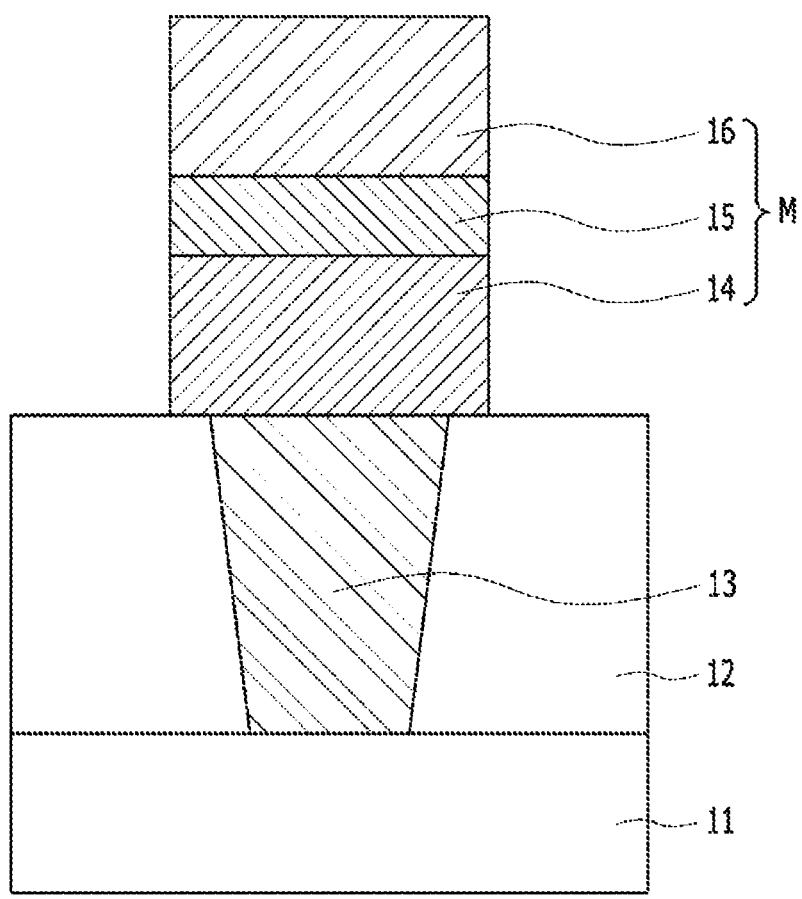
FIGS. 3A to 3D are cross-sectional views illustrating a method for fabricating a semiconductor device in accordance with an implementation of the technology disclosed in this patent document.

Referring to FIG. 3A, a predefined structure, e.g., a substrate 11 where a switching element (not shown) is formed is provided. Herein, the switching element is for selecting a predetermined unit cell in the semiconductor device including a plurality of unit cells and may include a transistor, or a diode, etc. One side of the switching element may be electrically connected to a first contact plug, which is to be described below, and the other side of the switching element may be electrically connected to a source line.

Subsequently, a first inter-layer dielectric layer 12 is formed over the substrate 11. The first inter-layer dielectric layer 12 may be formed of a single layer including an oxide layer, a nitride layer or an oxide-nitride layer, or a stacked layer where two or more of them are stacked.

Subsequently, a first contact plug 13 may be formed to couple with the substrate 11 by passing through the first inter-layer dielectric layer 12. The first contact plug 13 may be or include a Bottom Electrode Contact (BEC) for coupling the switching element with variable resistance elements M which is to be described below. The first contact plug 13 may form a contact hole to expose the substrate 11 by passing through the first inter-layer dielectric layer 12 and be formed through a series of fabrication processes including an isolation process. The isolation process proceeds to electrically isolates spaces between neighboring first contact plugs 13 after gap-filling the contact hole with a conductive material. The isolation process may be performed by, for example, etching or polishing a conductive material formed over the structure until the first inter-layer dielectric layer 12 is exposed through a blanket etch process, e.g., an etch-back process, or a Chemical Mechanical Polishing (CMP) process.

Subsequently, variable resistance elements M are formed over the first inter-layer dielectric layer 12 including the first contact plug 13. The variable resistance elements M may include a stacked structure including a first magnetic layer 14, a tunnel barrier layer 15 and a second magnetic layer 16. Although not illustrated, a first electrode and a second electrode may be formed in the lower portion of the first magnetic layer 14 and the upper portion of the second magnetic layer 16, respectively, and the variable resistance elements M may further include a template layer, a combination layer and an interface layer for improving characteristics of the respective magnetic layers.

The variable resistance elements M may have the property of switching different resistance states based on magnetization directions of the first and second magnetic layers 14 and 16. For example, when the magnetization directions of the first and second magnetic layers 14 and 16 are the same or parallel to each other, the variable resistance elements M may have a low-resistance state, and when the magnetization directions of the first and second magnetic layers 14 and 16 are different from each other or anti-parallel to each other, the variable resistance elements M may have a high-resistance state.

One of the first magnetic layer 14 and the second magnetic layer 16 may be a pinned ferromagnetic layer whose magnetization direction is fixed, and the other may be a free ferromagnetic layer whose magnetization direction is varied based on a direction of current applied to the variable resistance elements M. Each of the first and second magnetic layers 14 and 16 may be a single layer or a multi-layer including a ferromagnetic material such as a Fe—Pt alloy, a Fe—Pd alloy, a Co—Pd alloy, a Co—Pt alloy, a Co—Fe alloy, a Fe—Ni—Pt alloy, a Co—Fe—Pt alloy and/or a Co—Ni—Pt alloy, and the single layer or the multi-layer may further include an impurity such as boron (B) but the disclosed technology in this patent document is not limited to this implementation.

The tunnel barrier layer 15 may allow electron tunneling and change the magnetization direction of the free ferromagnetic layer. The tunnel barrier layer 15 may be a single layer or a multi-layer including a dielectric material, e.g., an oxide such as $Al_2O_3$, MgO, CaO, SrO, TiO, VO and/or NbO, but the disclosed technology in this patent document is not limited to this implementation.

Figure 3B:
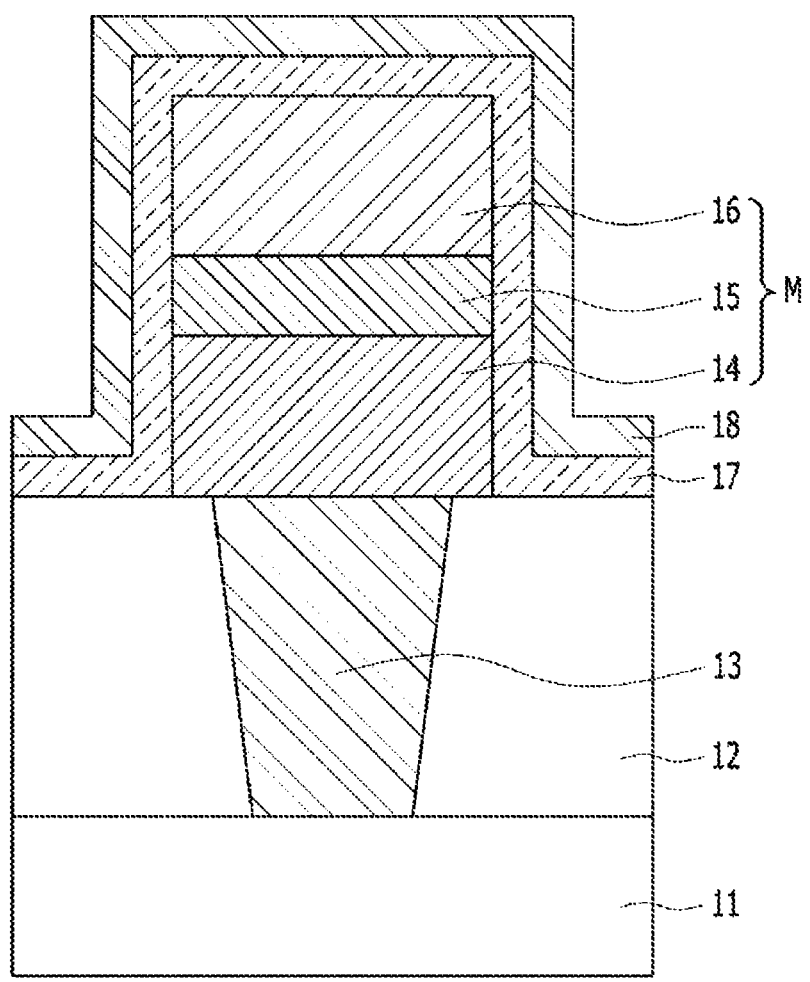

Referring to FIG. 3B, a stacked structure of a first aluminum nitride layer 17 containing carbon and a second aluminum nitride layer 18 not containing carbon may be formed over the structure including the variable resistance elements M. In another implementation, a single-layer structure including an aluminum nitride layer containing carbon may be formed as shown in FIG. 1A.

The first aluminum nitride layer 17 and the second aluminum nitride layer 18 may be formed through an Atomic Layer Deposition (ALD) process. The first aluminum nitride layer 17 and the second aluminum nitride layer 18 may be formed in-situ in the same chamber. The carbon content of the first aluminum nitride layer 17 and the second aluminum nitride layer 18 may be controlled by adjusting processing conditions, for example, the power of a plasma stage or a flux of a reaction gas.

The ALD process is to sequentially deposit a plurality of monoatomic layers. For example, under the ALD process, a source material and a reaction material are sequentially injected into a chamber and purged.

Although the ALD process uses a chemical reaction like a Chemical Vapor Deposition (CVD) process, the ALD process is different from the CVD process in that reaction sources are not mixed in the chamber and individually flow into a pulse. The ALD process may be performed in order. For example, during the ALD process, a source material injection process, a purge process, a reaction material injection process and a purge process are sequentially proceed. For example, after a chemical absorption process is performed by injecting the source material, a non-reaction source material remaining inside the chamber is purged with an inert gas. Subsequently, when the reaction material is injected, a reaction arises between the source material and the reaction material, and an atomic layer thin film is deposited. Lastly, after the reaction between the source material and the reaction material, the reaction material remaining in the chamber and a by-product of the reaction are purged.

As the ALD process described above uses a surface reaction mechanism, a uniform and stable thin film can be obtained. Also, since the source material and the reaction material are sequentially injected and purged by being isolated from each other, a generation of a particle is restrained by a gas phase reaction as compared with the CVD process.

The ALD process for forming the first and second aluminum nitride layers 17 and 18 may be repeatedly performed. For example, a unit cycle including a combination of the source injection process, the purge process, the plasma injection process or the purge process may be performed N times, where N is a natural number.

The source injection process is to supply an aluminum source into the chamber with a substrate where an aluminum nitride layer is to be deposited. The aluminum source may be absorbed onto a surface of the substrate by the supply of the aluminum source. For example, the aluminum source may include a source gas of including Trimethyl Aluminum (TMA: $(CH_3)_3Al$), Tris(tertiary-buty)Aluminum (TTBA: $Al[C(CH_3)_3]_3$), or aluminum chloride ($AlCl_3$). For example, the source injection process may be controlled for between approximately 0.5 seconds to approximately 10 seconds, and a source transmit gas may include helium (He) gas or argon (Ar) gas. The source transmit gas may use a flux between approximately 100 sccm and approximately 500 sccm.

The purge process is to remove surplus aluminum sources remaining after the absorption reaction and may use an inert gas that does not react with the aluminum source as a purge gas. For example, the purge gas may use an inert gas of one selected from the group including $N_2$, Ar and He. The purge gas may use a flux of approximately 500 sccm to approximately 5000 sccm, and an injection time may be controlled between approximately 0.5 seconds to approximately 10 seconds.

Subsequently, the plasma injection process may be performed. The plasma injection process is to disassemble a ligand of a material used for the aluminum source and may be performed as a remote plasma process. As the remote plasma is used, the substrate may be prevented from being physically damaged by the plasma. A gas including $N_2$, $H_2$, or a mixed gas of $N_2/H_2$ and $NH_3$ may be used to generate the plasma, i.e., the reaction gas. The reaction gas may control a flux of approximately 300 sccm to approximately 10000 sccm. The power may be controlled to be between approximately 500 W to approximately 10000 W. The plasma process time and/or reaction gas injection time may be controlled to be between approximately 1 second to approximately 10 seconds.

In this implementation, the plasma process may be controlled in order to form the first aluminum nitride layer 17. The content of carbon in the layer may be controlled by controlling a flux and power of the reaction gas. The content of carbon in the layer may be controlled to be approximately 10% or more to maximize the gathering effect.

For example, the flux of the reaction gas for forming the first aluminum nitride layer 17 containing carbon may be controlled from approximately 300 sccm to approximately 3000 sccm or less, and the power may be controlled from approximately 500 W to approximately 3000 W or less. Since the second aluminum nitride layer 18 not containing carbon removes all the carbon contained in the source gas, the process for forming the second aluminum nitride layer 18 may be performed to have greater flux and power of the reaction gas as compared to the process for forming the first aluminum nitride layer 17. For example, the flux of the reaction gas for forming the second aluminum nitride layer 18 may be controlled from over approximately 3000 sccm to approximately 10000 sccm, and the power may be controlled from over approximately 3000 W to approximately 10000 W.

Lastly, the purge process may be to purge reaction by-products and reaction materials remaining after reaction. The purge process may use an inert gas as a purge gas, and for example, the purge gas may use the inert gas including $N_2$, Ar and/or He.

As described above, by controlling the power of the plasma injection process and flux of the reaction gas, the carbon adjoining the aluminum source in the layer properly remains and the first aluminum nitride layer (AlCN) 17 containing carbon may be formed. If the flux of the reaction gas and the plasma process power increase during the plasma injection process, since the amount of carbon molecules in the layer which are activated and isolated increases. Thus, the concentration of the carbon in the layer decreases and the first aluminum nitride layer 17 and the second aluminum nitride layer 18 may be separately formed from each other.

Table 1 indicates how the amount of carbon in a layer changes according to conditions.

TABLE 1

| Variable | Increase or Decrease | HOW Carbon Amount CHANGES in Layer |
|---|---|---|
| Reaction Gas | Increase | Decrease |
| Flux | Decrease | Increase |
| Plasma | Increase | Decrease |
| Process Power | Decrease | Increase |

Referring to Table 1, the processing conditions capable of controlling the carbon amount in the layer include the two factors, and the reaction flux and the plasma process power may be inversely proportion to the carbon amount in the layer.

As described above, the first aluminum nitride layer 17 containing carbon and the second aluminum nitride layer 18 not containing carbon may be separately formed by controlling the reaction gas flux and the plasma process power, and the first aluminum nitride layer 17 containing carbon may prevent the sidewalls of the variable resistance elements M from being oxidized as unstable carbon (C) contained in the layer gathers oxygen in the variable resistance elements M. Also, the first aluminum nitride layer 17 containing carbon may improve characteristics of the elements by deoxidizing a pre-oxidized part of the variable resistance elements M as well as preventing oxidation.

The conditions of the ALD process described in this implementation are provided as one example, and other implementations are also possible for various conditions and needs.

Figure 3C:
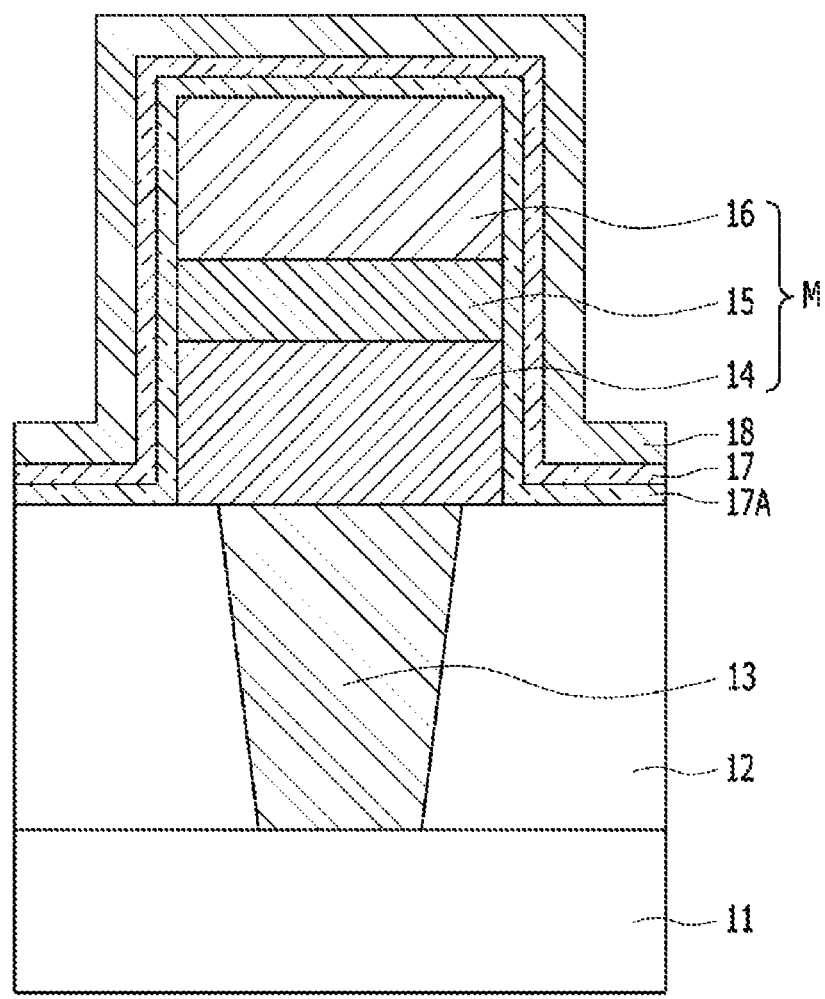

Referring to FIG. 3C, a thermal process is performed. A surface of the first aluminum nitride layer 17 coupled with the variable resistance elements M may be converted to an aluminum nitride layer 17A containing carbon and oxygen through the thermal process. For example, the first aluminum nitride layer 17 may be or include a stacked structure of the aluminum nitride layer 17A containing carbon and oxygen and the aluminum nitride layer 17 containing carbon. The aluminum nitride layer 17A containing carbon and oxygen may be represented by $AlCO_xN$, where x is a natural number.

The aluminum nitride layer 17A containing carbon and oxygen may be formed by an oxygen gathering effect of the aluminum nitride layer 17 containing carbon. In other words, as unstable carbon (C) in the first aluminum nitride layer 17 containing carbon gathers oxygen in the layer of the variable resistance elements M through the thermal process, the aluminum nitride layer 17A containing carbon and oxygen may be formed on the surface of the first aluminum nitride layer 17 coupled with the variable resistance elements M. The final structure formed by the gathering effect may be or include a stacked structure of $AlCO_xN$ 17A, where x is a natural number, the first aluminum nitride layer (AlCN) 17, and the second aluminum nitride layer (AlN) 18.

Figure 3D:
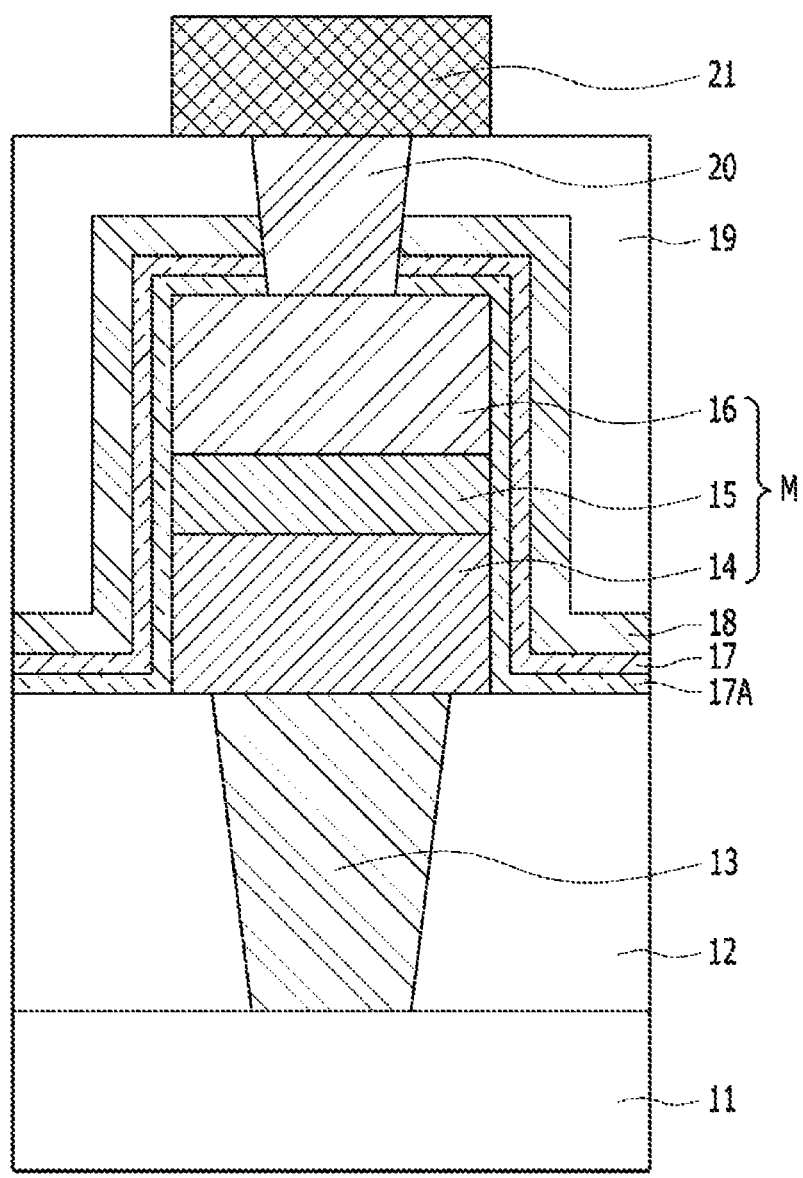

Referring to FIG. 3D, a second inter-layer dielectric layer 19 may be formed over the second aluminum nitride layer 18. The second inter-layer dielectric layer 19 may be formed to have a sufficient thickness to fill the space between the variable resistance elements M. For example, the second inter-layer dielectric layer 19 may be formed to have a higher surface (or thickness) than the upper portion of the variable resistance elements M including the second aluminum nitride layer 18. The second inter-layer dielectric layer 19 may include a single layer including an oxide layer, a nitride layer or an oxide-nitride layer or a stacked layer where two or more of them are stacked.

Subsequently, a second contact plug 20 may be formed to pass through the second inter-layer dielectric layer 19, the double-layered aluminum nitride layer 17A and aluminum nitride layer 17 and the second aluminum nitride layer 18 and be coupled with the variable resistance elements M. The second contact plug 20 may form a contact hole exposing the upper portion of the variable resistance elements M by passing through the second inter-layer dielectric layer 19, the double-layered aluminum nitride layer 17A and aluminum nitride layer 17 and the second aluminum nitride layer 18. After burying a conductive material in the contact hole, the second contact plug 20 may be formed through a series of fabrication processes performing an isolation process that electrically isolates spaces between neighboring second contact plugs. The isolation process may be performed by, for example, etching or polishing a conductive material formed over the structure until the second inter-layer dielectric layer 19 is exposed through a blanket etch process, e.g., an etch-back process, or a Chemical Mechanical Polishing (CMP) process.

The second contact plug 20 may be formed of or include a semiconductor layer or a metallic layer. The semiconductor layer may include a silicon layer. The metallic layer includes a conductive layer including a metal element and may include the conductive layer including a metal element including a metal layer, a metal oxide layer, a metal nitride layer, a metal oxide-nitride layer, or a metal silicide layer, etc.

Subsequently, a conductive line 21 may be formed over the second inter-layer dielectric layer 19 including the second contact plug 20.

The conductive line 21 may include a metallic layer. The metallic layer is or includes a conductive layer including a metal element and may include the conductive layer including a metal element including a metal layer, a metal oxide layer, a metal nitride layer, a metal oxide-nitride layer, or a metal silicide layer, etc. The conductive line 21 may be a bit line.

The above and other memory circuits or semiconductor devices based on the disclosed technology can be used in a range of devices or systems. FIGS. 4-8 provide some examples of devices or systems that can implement the memory circuits disclosed herein.

Figure 4:
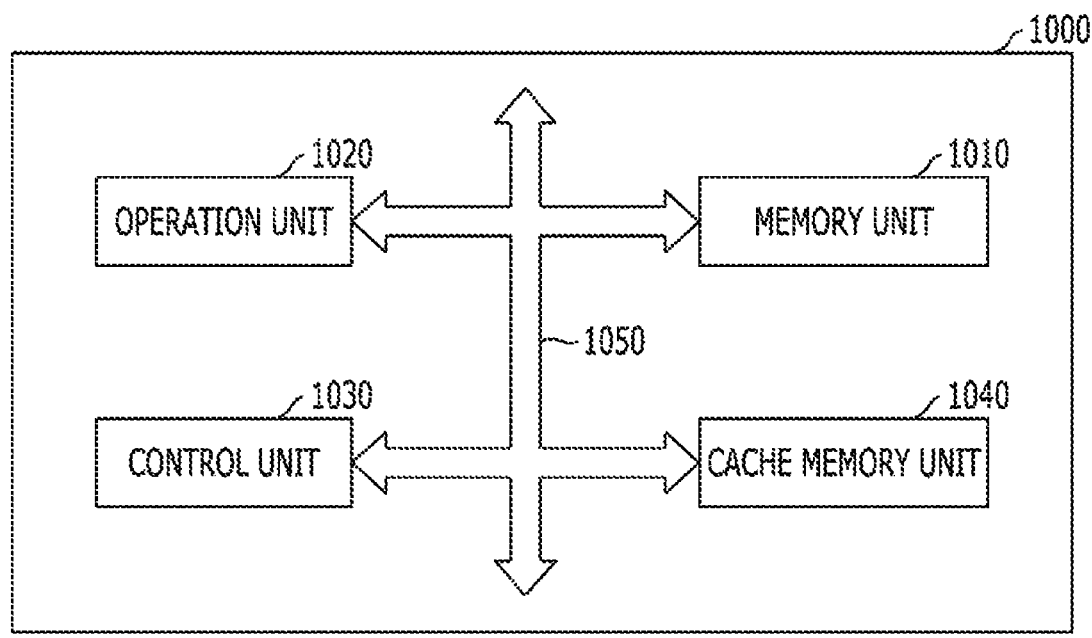
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element formed over a substrate; and a carbon-containing aluminum nitride layer formed on sidewalls and in an upper portion of the variable resistance element. Through this, a fabrication process of the memory unit 1010 may be performed in such a way to improve the data storage characteristic of the memory unit 1010. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
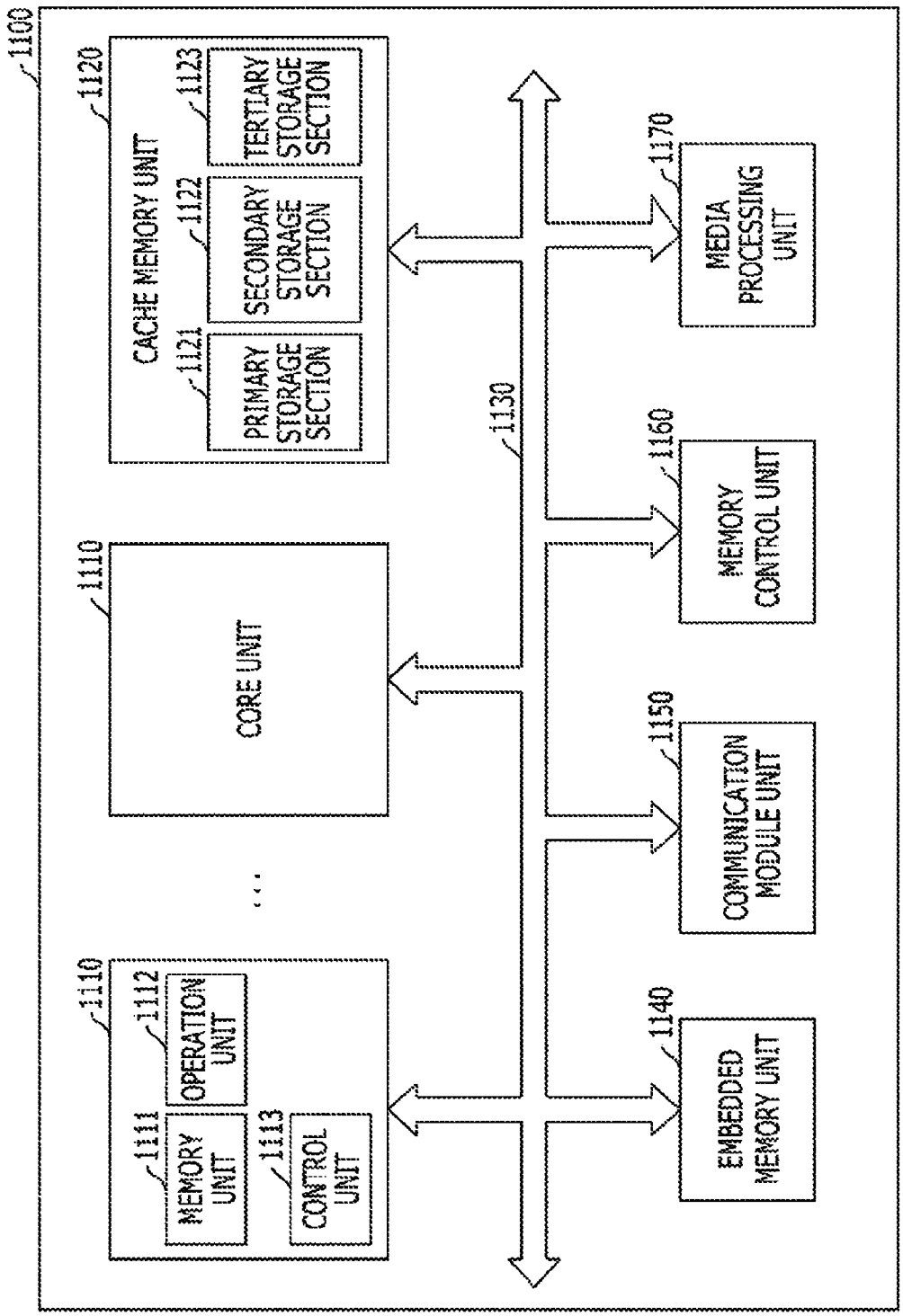
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element formed over a substrate; and a carbon-containing aluminum nitride layer formed on sidewalls and in an upper portion of the variable resistance element. Through this, a fabrication process of the memory unit 1120 may be performed in such a way to improve the data storage characteristic of the memory unit 1120. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit

1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
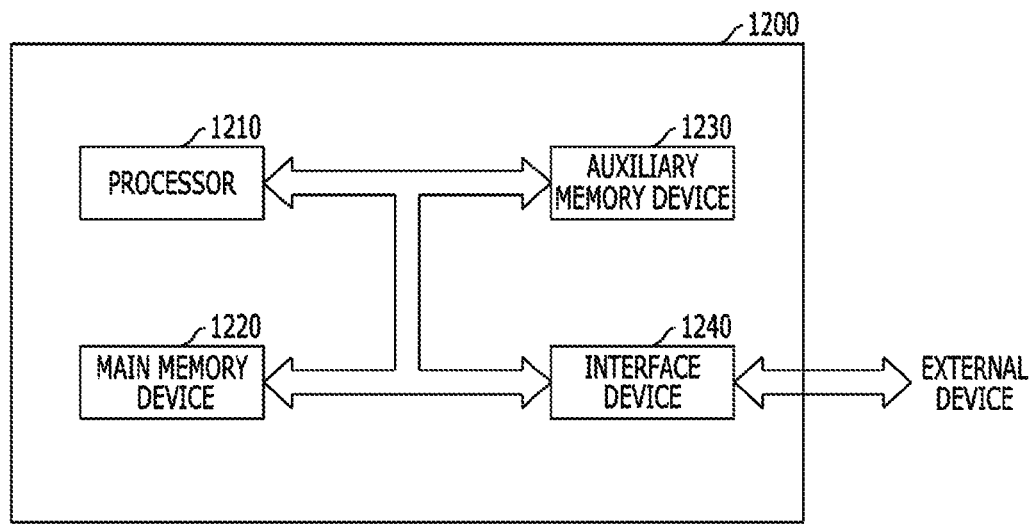
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element formed over a substrate; and a carbon-containing aluminum nitride layer formed on sidewalls and in an upper portion of the variable resistance element. Through this, a fabrication process of the memory unit 1220 may be performed in such a way to improve the data storage characteristic of the memory unit 1220. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element formed over a substrate; and a carbon-containing aluminum nitride layer formed on sidewalls and in an upper portion of the variable resistance element. Through this, a fabrication process of the memory unit 1230 may be performed in such a way to improve the data storage characteristic of the memory unit 1230. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
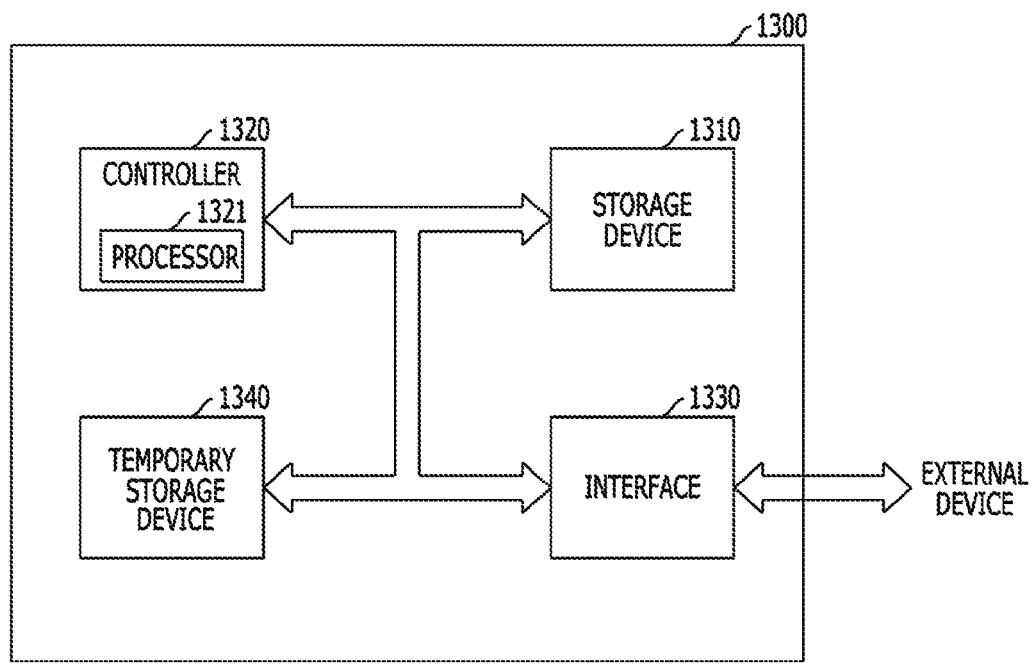
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element formed over a substrate; and a carbon-containing aluminum nitride layer formed on sidewalls and in an upper portion of the variable resistance element. Through this, a fabrication process of the storage device 1310 or the temporary storage device 1340 may be performed in such a way to improve the data storage characteristic of the storage device 1310 or the temporary storage device 1340. As a consequence, operating characteristics of the data storage system 1300 may be improved.

Figure 8:
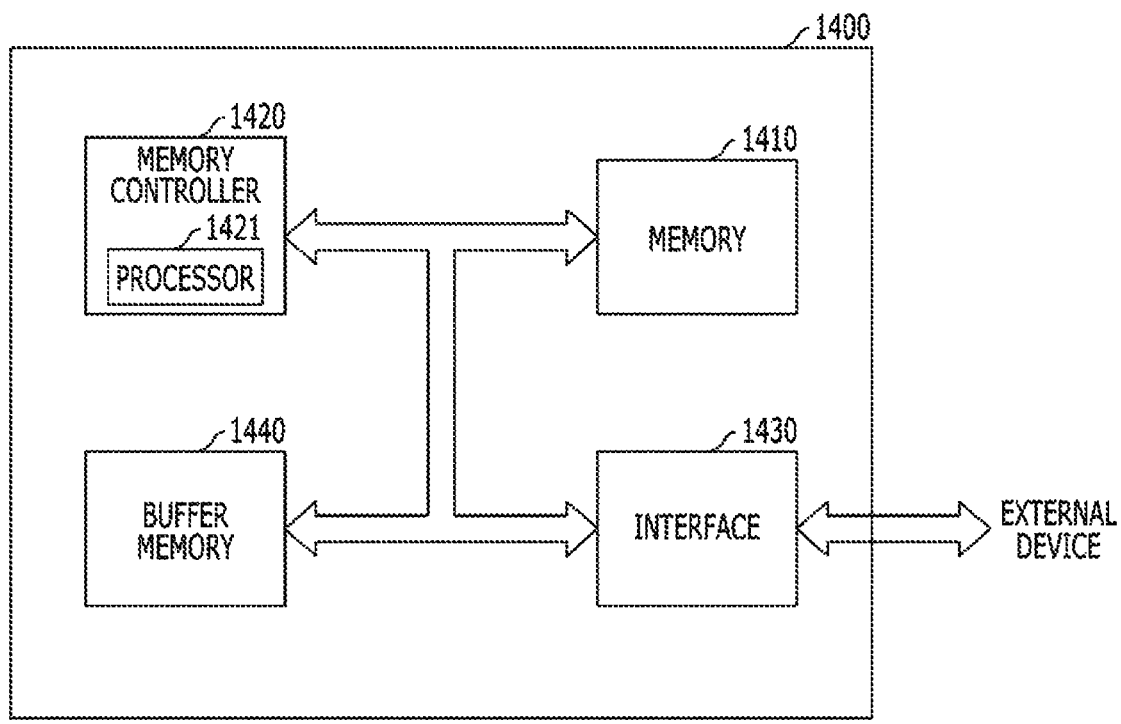
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element formed over a substrate; and a carbon-containing aluminum nitride layer formed on sidewalls and in an upper portion of the variable resistance element. Through this, a fabrication process of the memory 1410 may be performed in such a way to improve the data storage characteristic of the memory 1410. As a consequence, operating characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element formed over a substrate; and a carbon-containing aluminum nitride layer formed on sidewalls and in an upper portion of the variable resistance element. Through this, a fabrication process of the buffer memory may be performed in such a way to improve the data storage characteristic of the buffer memory. As a consequence, operating characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the implementations described in this patent document should not be understood as requiring such separation in all implementations. Only a few implementations and examples are described. Other implementations, enhancements and variations can be made based on what is described and illustrated in this patent document.

What is claimed is:

1. An electronic device comprising a semiconductor memory that includes:
   a substrate;
   a variable resistance element formed over the substrate; and
   a carbon-containing layer formed over the variable resistance element and including carbon that gathers oxygen.

2. The electronic device according to claim 1, wherein the carbon-containing layer includes a single or a double layer.

3. The electronic device according to claim 1, wherein the carbon-containing layer includes an aluminum nitride layer containing carbon and oxygen and another aluminum nitride layer containing carbon.

4. The electronic device according to claim 1, wherein the carbon-containing layer includes 10% or more of carbon.

5. The electronic device according to claim 1, wherein the carbon-containing layer is formed on sidewalls and in an upper portion of the variable resistance element.

6. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit is part of the cache memory unit in the processor.

7. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory unit is part of the storage device or the temporary storage device in the data storage system.

8. The electronic device according to claim 1, further comprising:
   a carbon-free layer formed over the carbon-containing layer.

9. The electronic device according to claim 8, wherein the carbon-containing layer includes a staked structure of an aluminum nitride layer containing carbon and oxygen and an aluminum nitride layer containing carbon.

* * * * *